United States Patent [19]

Uemoto et al.

[11] Patent Number: 5,281,831
[45] Date of Patent: Jan. 25, 1994

[54] OPTICAL SEMICONDUCTOR DEVICE

[75] Inventors: Tsutomu Uemoto, Yokohama; Atsushi Kamata, Chigasaki; Hidetoshi Fujimoto, Kawasaki; Hiroshi Mitsuhashi, Tokyo, all of Japan

[73] Assignee: Kabushiki Kaisha Toshiba, Kawasaki, Japan

[21] Appl. No.: 784,706

[22] Filed: Oct. 30, 1991

[30] Foreign Application Priority Data

Oct. 31, 1990 [JP] Japan ................... 2-294059
Nov. 30, 1990 [JP] Japan ................... 2-329507
Aug. 7, 1991 [JP] Japan ................... 3-222234

[51] Int. Cl.⁵ .................. H01L 29/167; H01L 29/227; H01S 3/19
[52] U.S. Cl. .................... 257/102; 257/103; 257/607; 257/86
[58] Field of Search ............ 357/17, 61; 257/102, 257/86, 103, 607

[56] References Cited

U.S. PATENT DOCUMENTS

| | | | |
|---|---|---|---|
| 3,735,212 | 5/1973 | Kun | 357/61 |
| 4,213,781 | 7/1980 | Norieka et al. | 357/61 |
| 4,857,971 | 8/1989 | Burnham | 357/17 |
| 5,117,267 | 5/1992 | Kimoto et al. | 357/61 |

FOREIGN PATENT DOCUMENTS 246779 8/1988 Japan .

OTHER PUBLICATIONS

Physical Review, vol. 170, No. 3, pp. 739-748, Jun. 15, 1968, Cuthbert et al: Temperature-Dependent Radiative Recombination . . .

*Primary Examiner*—Jerome Jackson
*Attorney, Agent, or Firm*—Oblon, Spivak, McClelland, Maier & Neustadt

[57] ABSTRACT

AlN is added to a SiC light emitting layer of an optical semiconductor device in a molecular state, and an association of AlN is formed between crystal lattice points, which are close to each other in said light emitting layer. Said association is largely different from said SiC in degree of electron negativity so that said association traps a carrier in said light emitting layer, and forms an exciton.

20 Claims, 9 Drawing Sheets

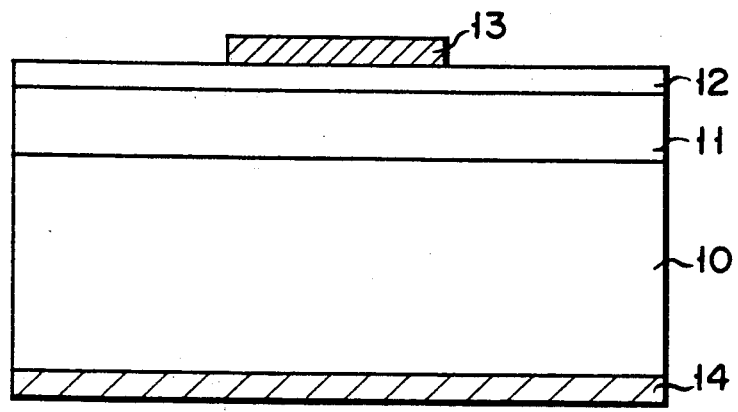
F I G. 1
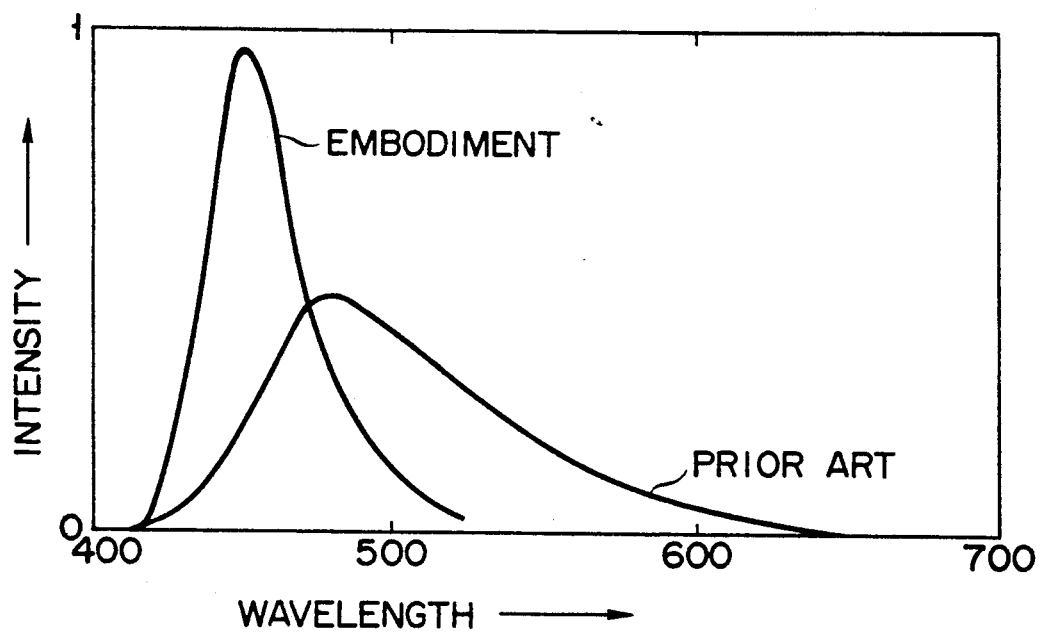
F I G. 2

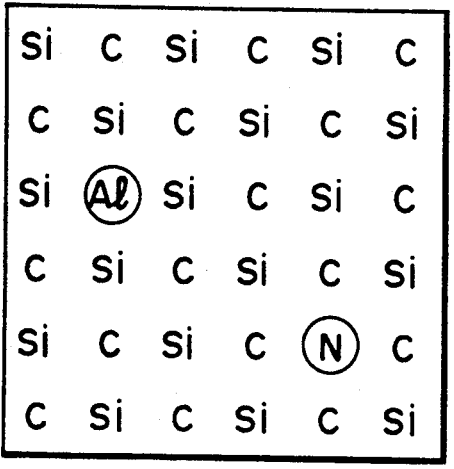
F I G. 3A
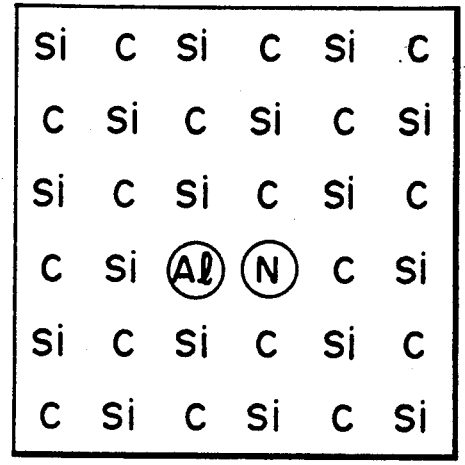
F I G. 3B
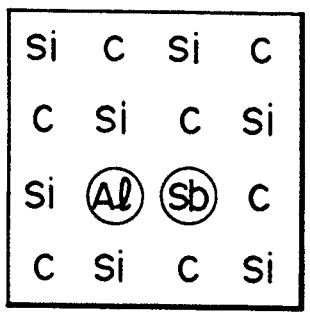
F I G. 6A
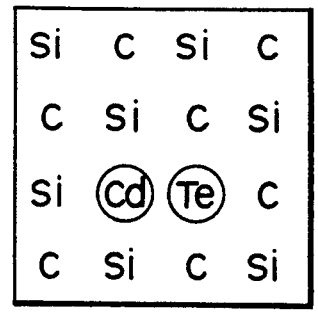
F I G. 6B
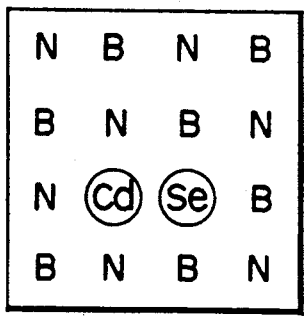
F I G. 6C
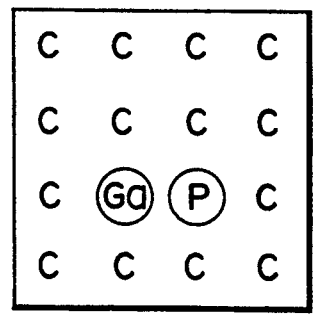
F I G. 6D

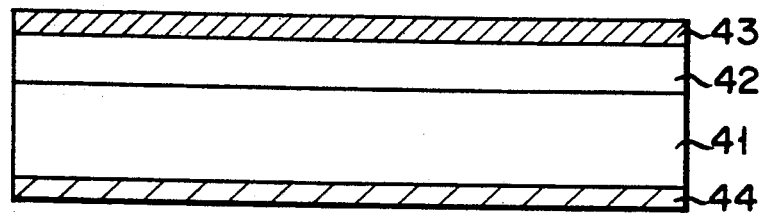
F I G. 4
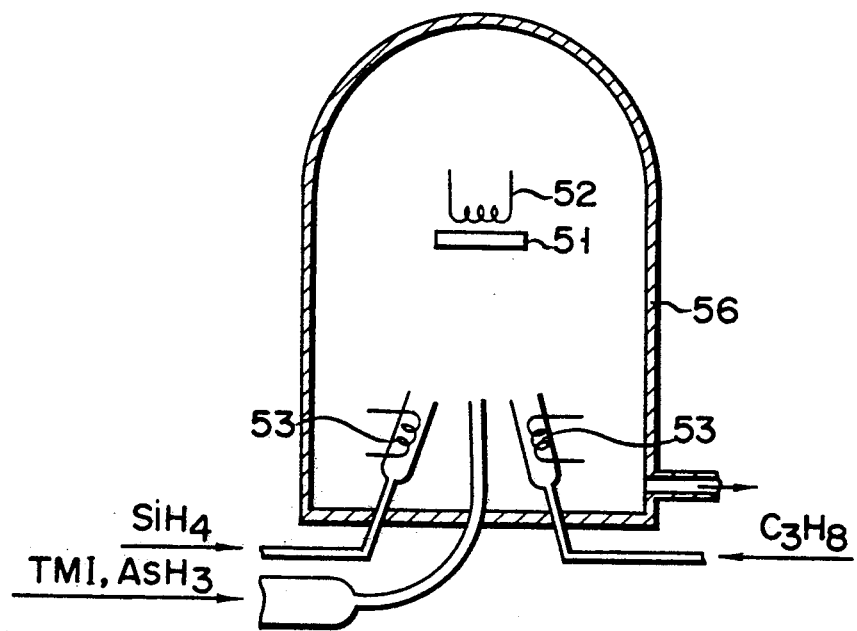
F I G. 5

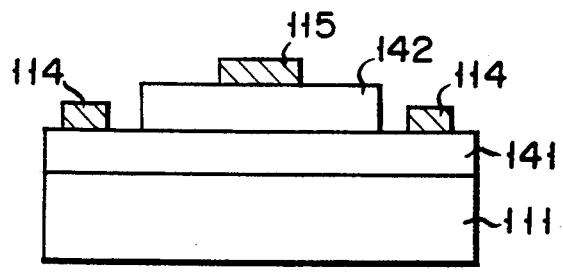
F I G. 10
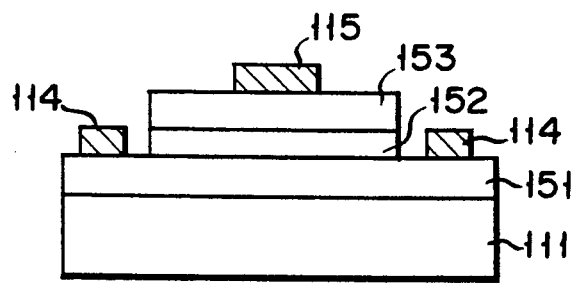
F I G. 11
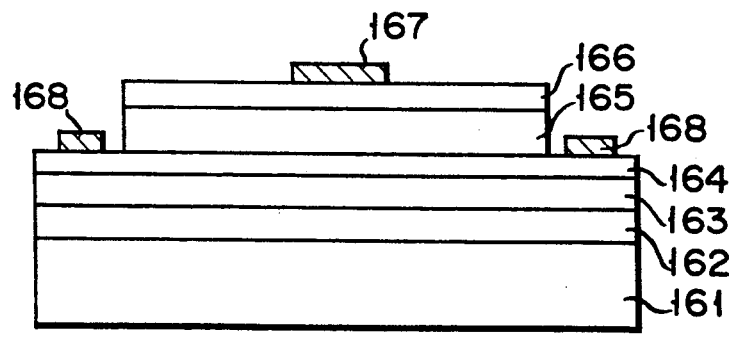
F I G. 12

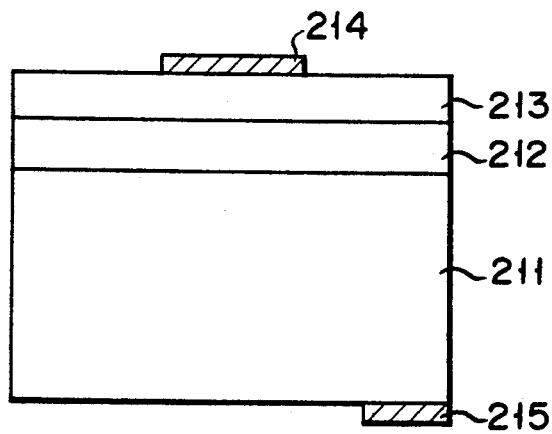
F I G. 15
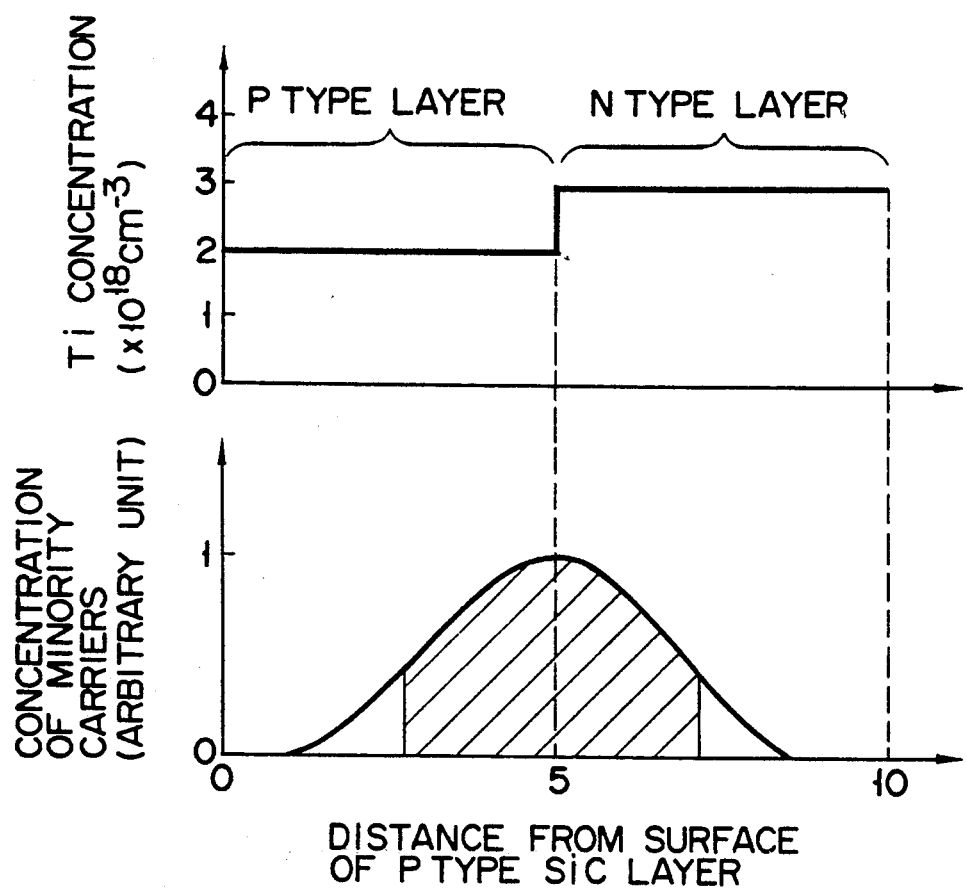
F I G. 16

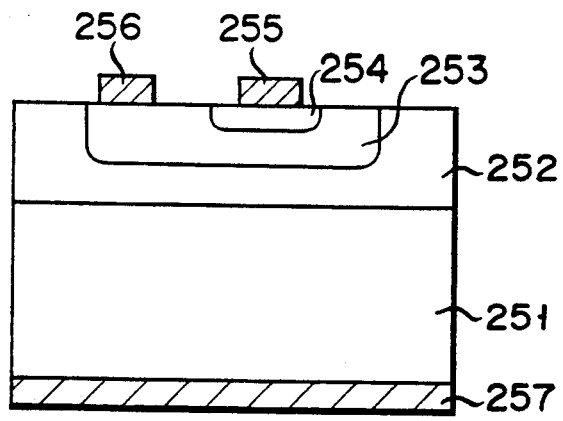
F I G. 18
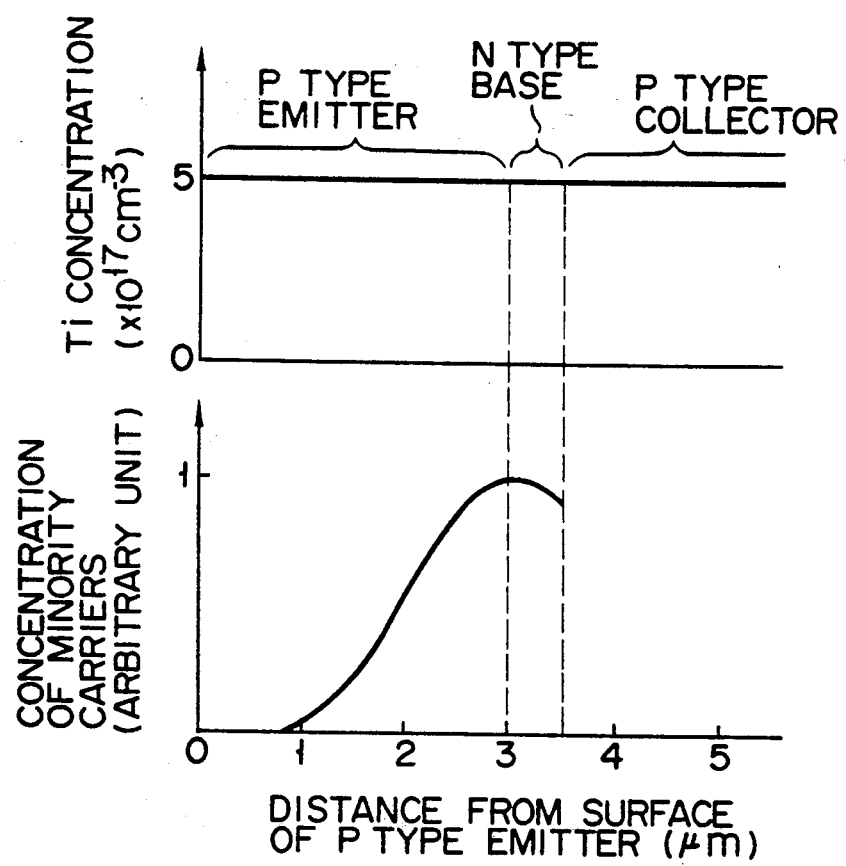
F I G. 19

OPTICAL SEMICONDUCTOR DEVICE

BACKGROUND OF THE INVENTION

Field of the Invention

The present invention relates to an optical semiconductor device formed of a material such as silicon carbide, and used in a visible shorter wavelength and an ultraviolet light emitter.

Description of the Related Art

Light emitting elements, which use a semiconductor and have light emitting regions including red to green, have been put to practical use and widely employed in various types of display elements. However, since a blue light emitter as one of primary colors has not been developed, the image display is lacking for the blue light. Due to this situation, a light emitter having a blue luminous intensity which is equal to red and green luminous intensity.

Conventionally, a semiconductor such as Ga(Al)As, Gap and the like is used as a light emitter of red to green. However, a blue color cannot be emitted with the forbidden band widths of these semiconductors. As material having a wide forbidden band, there are semiconductors of II-VI of such as ZnSe, and ZnS, semiconductors of group III-V such as GaN, and cubic type BN, semiconductors of group IV such as SiC, and diamond, and the like. However, generally, in a natural with such a wide forbidden band difficulty is encountered in controlling the conductivity type, and the only material in which a pn junction can be made is cubic BN and the semiconductor of group IV. However, since cubic BN can be manufactured at only high pressure, there is a disadvantage in that a large crystal, which is sufficient for practical use, can not be obtained. Moreover, regarding the semiconductor of group IV, both SiC and diamond have an indirect transition type forbidden band, and there is a disadvantage in that the light emitting efficiency is low.

In such indirect transition semiconductors, the isoelectronic trap method is generally used, which is employed in a GaP semiconductor, to improve radiative efficiency. The trap is not and impurity which changes conductivity, but attracts electric charges by Coulomb force and generates exciton, thereby increasing radiative efficiency. However, in the semiconductor of group IV such as SiC, since the structure of the conductivity band is different from that of the GaP semiconductor, it has been considered that the above-mentioned isoelectronic trap is not formed. In other words, it has been suggested that a light emitter having high luminous intensity cannot be manufactured by use of a semiconductor of group IV such as SiC.

SUMMARY OF THE INVENTION

An object of the present invention is to solve the above-mentioned problems and provide a semiconductor element in which light can be emitted in a shorter wavelength region than blue light.

According to a first aspect of the present invention, there is provided an optical semiconductor device wherein dopant comprising group II atom and group VI atom is added to a semiconductor light emitting layer in a molecular state, an association comprising the group II atom and the group VI atom is formed between crystal lattice points, which are close to each other in the light emitting layer, and the association is largely different from the semiconductor forming the light emitting layer in degree of electron negativity so that the association traps a carrier in the light emitting layer and forms an exciton.

According to a second aspect of the present invention, there is provided an optical semiconductor device wherein dopant comprising group III atoms and group V atom is added to a semiconductor light emitting layer in a molecular state, an association comprising the group III atom and the group V atom is formed between crystal lattice points, which are close to each other in the light emitting layer, and the association is largely different from the semiconductor forming the light emitting layer in degree of electron negativity so that the association traps a carrier in the light emitting layer and forms an exciton.

The above-mentioned molecular state means a state where the minimum number of atoms constituting a dopant are bonded together to be in a stable state, for example, an eight valence state in GaAs wherein one Ga and one As are bonded and paired.

According to the present invention, it is possible to manufacture light emitters in a violet or ultraviolet region where such manufacture is conventionally difficult. Moreover, it is possible to advance industrialization to obtain crystals having a large area and high quality for manufacturing the light emitters.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross sectional view showing an optical semiconductor layer according to a first embodiment of the present invention;

FIG. 2 is a diagram showing a light emitting spectrum of the first embodiment of the present invention;

FIGS. 3A and 3B are views showing the relationship between base atoms and impurity atoms in lattice point in a light emitting layer of the prior art and that of the present invention, respectively;

FIG. 4 is a cross sectional view showing an optical semiconductor layer according to a second embodiment of the present invention;

FIG. 5 is a cross sectional view showing an apparatus for manufacturing crystals according to the present invention;

FIGS. 6A to 6D are views each showing another combination of base atoms and impurity atoms according to the present invention in the same manner as FIGS. 3A and 3B;

FIGS. 7 to 11 are cross sectional views showing optical semiconductor layers according to third to seventh embodiments of the present invention, respectively;

FIGS. 12 to 14 are cross sectional views showing an optical semiconductor layers according to ninth to eleventh embodiments of the present invention, respectively;

FIG. 15 is a cross sectional view showing an optical semiconductor layer according to a twelfth embodiment of the present invention;

FIG. 16 is a view showing a distribution of minority carriers in the vicinity of the pn junction boundary surface of the twelfth embodiment of FIG. 15, and a distribution of concentration of Ti obtained by a secondary ion mass spectrometry;

FIG. 18 is a cross sectional view of the optical semiconductor device of a thirteenth embodiment of the present invention; and FIG. 19 is a view showing a distribution of minority carriers in the vicinity of the pn junction boundary surface of the thirteenth embodiment of FIG. 18, and a distribution of concentration of Ti obtained by a secondary ion mass spectrometry.

DETAILED DESCRIPTION OF THE PREFERRED EMBODIMENTS

Figure 7:
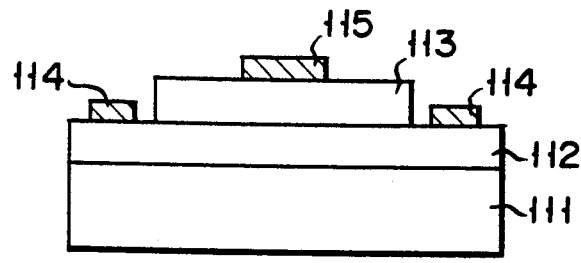

The inventors of the present invention studied semiconductor layers of group IV such as SiC, diamond and have found out the following points.

In a case where a group III element such as B, Al, or Ga, a group element such as N, P, or As, a group II element such as Be, Zn, or Cd, or a group VI element such as O, S, or Se is added to the semiconductor layer, the radiative efficiency increases in a state where the concentration of each element is $1 \times 10^{16}$ to $1 \times 10^{20}$. Also, in a case where group III and V elements are added to the semiconductor layer in equal amounts or group II and VI elements are added to the semiconductor layer in equal amounts, the radiative efficiency increases in a state where the concentration of each element is $1 \times 10^{16}$ to $1 \times 10^{20}$.

In a case where III and V group elements serving as impurity elements are added to the semiconductor layer, growth of group IV semiconductor layer is performed by use of a molecule or a molecular ion including both impurity elements as constituent, thereby the radiative efficiency of the obtained semiconductor layer increases. Also, the same result can be obtained in a case where group II and VI elements as impurity elements are added to the semiconductor layer.

In a case where the group III and V elements or the group II and VI elements are added to the semiconductor layer at the same time, it can be considered that an association of both impurity elements is formed between crystal lattice points, which are close to each other in the IV group semiconductor layer, by use of the molecule or molecular ion including both impurity elements as constituent.

The valence of the association is eight, and this can not used as impurity, which changes conductivity in the IV group semiconductor layer. Also, regarding the light emitting characteristic, since energy of light emitting is close to a forbidden band width, the deep light emitting center cannot be obtained. Therefore, it can be considered that the increase in the radiative efficiency of the group IV semiconductor layer is the same effect as the isoelectronic trap used in a Gap semiconductor.

Moreover, as regards the degree of electron negativity, SiC and diamond include C having a large degree of electron negativity in the molecule as compared with the association formed of introduced impurity elements. Due to this, in a case where the association is formed, there is a high possibility that a hole will be trapped around the association and an exciton will be formed. As a result of the above-mentioned study, it is concluded that the association traps an electric charge as an isoelectronic trap and the radiative efficiency is increased.

The present invention is clearly different in the function from the case in which two compounds including the group III and V elements, respectively, are introduced at the same time. When the two compounds separately including the III and V group elements, are introduced, as shown in FIG. 3A, impurity elements enter free lattice points. Due to this, in the prior art, Coulomb force strongly works as a long distance and no isoelectronic trap is formed. In contrast, according to the present invention, impurity elements enter between crystal lattice points, which are close to each other, and isoelectronic trap is formed as shown in FIG. 3B.

Moreover, in the prior art, when the kind of element is changed, the radiative efficiency remain remain unchanged unless the depth of the impurity level changes. In contrast, according to the present invention, the radiative efficiency can increase regardless of the depth of impurity level. Moreover, in the present invention, a large effect can be obtained only when the semiconductor constituent elements and the doped elements are largely different in the degree of electron negativity.

Furthermore, the present invention is different from a mixed crystal of a group IV semiconductor and a group III-V or II-VI semiconductor in terms of the function. In the case of the mixed crystal, there appears properties of the semiconductors constituting the mixed crystal. For example, in a case where a direct transition semiconductor is mixed with a IV group semiconductor, the type of the resultant mixed crystal semiconductor is changed from the indirect transition to the direct transition if the ratio of the added or mixed semiconductor reaches to a certain value, and the radiative efficiency drastically changes. In order to obtain such an effect, the added semiconductor must have a large existence ratio, such as a mixing ratio of at least several percentages or more, enough to show its property. However, the present invention shows its effect and the change in the function by the mixing ratio which is much smaller than the above percentages.

According to the present invention, a semiconductor layer of group III-V such as BN or a semiconductor layer of other compounds can be used as a light emitting layer, that is, base material, in place of the semiconductor layer of group IV.

FIGS. 6A to 6D ar views showing the other combinations of the base atoms and impurity atoms relating to the present invention in the same manner as FIGS. 3A and 3B.

The embodiments of the present invention will be explained.

FIG. 1 is a cross sectional view showing a light emitting diode of SiC:AlN which is a first embodiment of the present invention. A Metal Organic Chemical Vapor Deposition (MOCVD) method is used for growing layers.

First of all, a (0001)-face-cut 6H-SiC crystal 10 of n type is inserted in an MOCVD apparatus, and its surface is processed at high temperature. Then, growth temperature is decreased to 1500° C. Thereafter, Dimethylaminoduthylaluminum $((CH_3)_2NAl(C_2H_5)_2)$ including Al and N at the same time, both of which are impurity materials, and diluted by carrier gas; saline gas for Si material; and propane gas for carbon material, are introduced into a reaction tube. More specifically, in order to grow an n type SiC light emitting layer 11, ammonium gas, serving as conductive decision impurity, is introduced into the reaction tube together with the above-mentioned gases at the same time. Thereafter, in order to grow a p type SiC layer 12, trimethyl aluminum, serving as conductive decision impurity, is introduced therein. The growth thickness of n layer and that of p layer are 5 μm and 1 μm, respectively. The carrier concentration of n layer and that of p layer are $n = 1 \times 10^{17}/cm^3$ and $p = 5 \times 10^{18}/cm^3$, respectively.

Thereafter, nickel (Ni) is deposited on the substrate side and Ti/Ai is deposited on the p growth layer side. Thereafter, an annealing process is performed in Ar gas at 1000° C., thereby an ohmic contact is formed. In the drawing, reference numeral 13 is a Ti/Al electrode, and reference numeral 14 an Ni electrode. Thereafter, the above-prepared crystal is cut to be an LED chip by a blade dicer, which is made of a diamond blade.

According to a first embodiment of the present invention, it is possible to manufacture a LED having higher radiative efficiency than the conventional LED. FIG. 2 shows the result in which the conventional LED using a pair of DA (donor and acceptor) is compared with the LED of the first embodiment of the present invention. As is obvious from FIG. 2, a large increase in radiative efficiency can be attained by the present invention.

FIG. 4 shows a diamond EL light emitter according to a second embodiment of the present invention. In this embodiment, a diamond film 42, serving as a light emitting layer, is grown on a Si substrate 41 by use of a heat filament CVD method. In this embodiment, it can be confirmed that the radiative efficiency becomes higher by introducing AlN into the light emitting layer. In the drawing, reference numeral 43 is a transparent electrode, and reference numeral 44 an Al electrode.

As a modification of the first and second embodiments, there can be formed an LED using a layer doped with GaN and ZnP, as a light emitting layer. As other dopants, III-V group compounds such as GaP, GaAs, and GaSb and II-VI group compounds such as MgO and MgS can be generally used.

In this embodiment, the inventors can confirm that the dopant elements having larger atomic number have larger radiative efficiency. However, in these elements, it is difficult for the pair of impurities to enter the lattice points close to each other. Due to this, as a modification of the manufacturing method of the optical semiconductor device according to the present invention, there can be employed an ion source using a mass separator for impurities in an MBE method.

FIG. 5 is an apparatus for growing a crystal of IV group in a CBE (chemical beam epitaxy) method. As material gases, trimethyl indium and arsine are mixed, decomposed and reacted by plasma, and introduced into the mass separator. InAs ion is introduced into the surface of the substrate. As semiconductor materials, $SiH_4$ and $C_3H_8$ are thermally decomposed and introduced into the surface of the substrate. It can be made clear from the inventors' study that the above-introduced impurities are considerably effective as the light emitting center. In addition, by changing the combinations of material gases, AlP, AlAS, AlSb, ZnS, ZnSe, ZnTe, CdO, CdS, CdSe, CdTe can be used as dopant.

Furthermore, according to the present invention, it is possible to selectively implant the ion consisting of combined III-V or II-VI group elements into the semiconductor crystal by an ion implantation apparatus. By use of such a manufacturing method, it is possible to add impurities such as BN, BeO and the like which are conventionally difficult to be added.

Regarding the growth method other than MOCVD method, for example, a MBE (molecular beam epitaxy) can be used. In this case, for example, it is possible to use material gases such as $C_6H_8AlP$, and $C_4H_{10}GaN$ in order to add AlP and GaN, respectively.

Next, other embodiments will be explained.

FIG. 7 shows a cross sectional view of SiC:AlN light emitting diode according to a third embodiment of the present invention. The metal organic chemical vapor deposition (MOCVD) method is used a growth method.

First of all, a (0001)-face-cut sapphire crystal 111 is inserted in an MOCVD apparatus, and its surface is processed at high temperature. Then, growth temperature is decreased to 1500° C. Thereafter, trimethyl aluminum (TMA) for Al material, which is diluted by carrier gas, and ammonia gas ($NH_3$) for nitrogen (N) material, and saline gas for Si material, and propane gas for carbon material are introduced into the reaction tube.

In order to grow a p type layer 112, material including II group elements is introduced. In this embodiment, dimethyle zinc (DMZ) is used. Thereafter, DMZ is stopped and material of VI group for growing an n type layer 113 is introduced. In this embodiment, dimethyle selenium (DMSe) for Se material gas is introduced. The prepared semiconductor layer according to embodiment contains 10% of AlN.

After growing, the n type layer is partially etched and the p type layer is exposed. Thereafter, Al 114 is deposited on the p type layer and Ni 115 is deposited on the n type layer, and they are alloyed at 1000° C., so that ohmic electrodes are formed. The prepared light emitter according to the present invention shows inlet light emitting and has considerably higher light emitting intensity than the convention blue light emitter of SiC.

Figure 8:
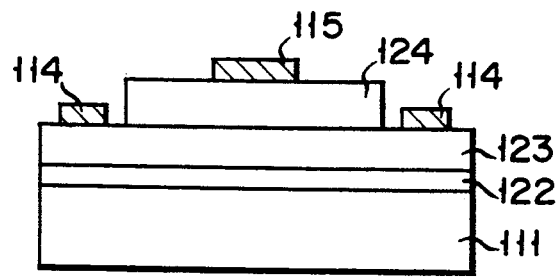

FIG. 8 shows a fourth embodiment of the present invention.

A monocrystal 122 of AlN is formed on a sapphire substrate, and a p type layer 123, which is the mixed crystal layer according to the present invention, and an n type layer 124 are formed thereon. Thereby, the quality of the crystal of the mixed crystal layer is largely improved.

Figure 9:
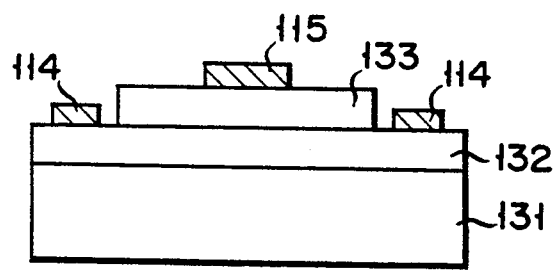

FIG. 9 shows a fifth embodiment of the present invention.

A p type layer 132 and an n type layer 133, each of which is the mixed crystal of AlN and SiC, are formed on a monocrystal 131 of SiC. Since the monocrystal having a thickness of 1 μm or more can be made of SiC and quality thereof is excellent, the quality of the mixed crystal layer formed on the monocrystal is also excellent.

FIG. 10 shows a sixth embodiment of the present invention.

By changing the composition ratio of AlN to SiC in a p type layer 141 and an n type layer 142, inflow efficiency of electric current to one of layers can be largely improved. In this modification, an AlN composition ratio in the n type layer is set to be larger than that in the p type layer, thereby the inflow efficiency to the p type layer becomes higher. As a result, it is possible to largely increase the radiative efficiency. Moreover, the AlN composition ratio in the n type layer may be set to be lower, so that the current may largely flow into the n type layer. In this case, that impurity is added, which is mainly used as light emitting center, other than the conductive decision impurity, thereby largely increasing the radiative efficiency.

FIG. 11 shows a seventh embodiment of the present invention.

On a first mixed crystal layer 151 having one conductive type, there is formed a second semiconductor layer 152 whose forbidden band is smaller than that of the first layer. On the second layer, there is formed a third mixed crystal layer 153 whose forbidden band is larger than that of the second layer and conductive type is different from that of the first layer. Either conductive type p or n may be considered. As a result, electric current can be efficiently implanted into the second layer, thereby largely improving the radiative efficiency. In this case, even if the second layer is formed of pure SiC, the radiative efficiency is improved.

According to the eighth embodiment, there is provided a layer contacting one or both of p and n type layers forming a pn junction, having the same conductivity type as, and a higher impurity concentration than said one or both layers, in order to make an electric current flow evenly therein. In the modification of the above embodiment, the geometrical arrangements of the p type layer and n type layer can be freely made, and for example, the n type layer in FIG. 7 may be first formed. Moreover, it is possible to grow the layer of the present invention by the molecular beam epitaxy (MBE) or the liquid phase epitaxy (LPE). Furthermore, the present invention can be variously modified without departing the sprit of the invention.

FIG. 12 shows a ninth embodiment of the present invention. This embodiment relates to a 2H type crystal growing method. FIG. 12 is a cross sectional view of a bulk 2H type SiC light emitting diode of this embodiment according to the growing method of the present invention.

As a growing method, the metal organic chemical vapor deposition (MOCVD) is used.

First of all, a (0001)-face-cut sapphire 161 is inserted in the MOCVD apparatus, and its surface is processed at high temperature. Then, growth temperature is decreased to the growth temperature. Thereafter, by flowing trimethyl aluminum (TMA) for Al material, which is diluted by carrier gas, and ammonia gas ($NH_3$) for nitrogen (N) material, an AlN crystal 162 is grown on the surface of the substrate. At this time, the ammonia gas is flowed first, thereby making it possible to grow the good AlN crystal.

After growing the AlN crystal, silane and acetylene gas are further introduced, thereby a mixed crystal 163 of AlN and SiC is grown. Thereafter, only TMA is stopped and flow rate of the ammonia gas is reduced, and an n type SiC layer 164 is grown. In this case, the higher carrier concentration of the n layer is set to be about $1 \times 10^{19}/cm^3$.

Then, the flow rate of ammonia gas is further reduced and a small amount of trimethyl gallium for gallium material is flowed. In this state, an n type SiC layer 165 is grown. The n type SiC layer 165 is a light emitting layer and its carrier concentration is $5 \times 10^{17}/cm^3$. Then, TMA flows on the layer 165 and TMG and ammonia are stopped, thereby a p type layer 166 is grown.

The p type layer 166 has carrier concentration of $2 \times 10^{18}/cm^3$.

Thereafter, a reactive ion etching device (RIE) is used, and the p layer 166 and the n layer 165 are etched so that the n layer 164 is exposed. Thereafter, an alloy 167 of Al:Si is formed on the p layer and Ni 168 is formed on the n layer in a selective manner, and heat treatment is performed at a high temperature, so that ohmic contacts are formed.

The above-manufactured 2H type light emitter shows a color of blue violet, and its radiative efficiency is twice as much as that of the conventional 6H type light emitter.

The present invention explained in the ninth embodiment is not limited to such an embodiment. The present invention can be applied to all elements of 2H type. Also, the light emitter in which Al, rather than Ga, is added to the n layer 165 can be used as a light emitter for near ultraviolet to violet radiation. Moreover, a 2H type crystal is grown, thereafter, the sapphire substrate and AlN crystal are etched and removed. Thereby, a 2H type crystal substrate can be obtained and this can be variously applied. Next, on the 2H type crystal, there is grown SiC having other crystal structure with a small forbidden band width, so that a hetero structure is manufactured. Thereby, an light emitter having a good radiative efficiency can be manufactured.

Figure 13:
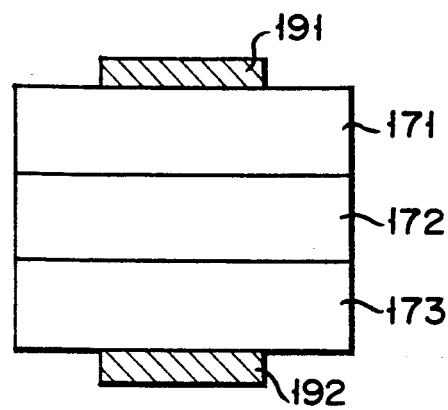

FIG. 13 shows a schematic cross sectional view of the structure of the light emitter according to a tenth embodiment of the present invention.

In the drawing, reference numeral 172 is a 2H type silicon carbide in which zinc of II group having $1 \times 10^{17}$ numbers/$cm^3$ and selenium of VI group having $1 \times 10^{18}$ numbers/$cm^3$ are added, and this is used as light emitting layer in the element structure of FIG. 13. Reference numeral 171 is a 2H type silicon carbide in which aluminum having $1 \times 10^{18}/cm^3$ is added. The layer 171 serves to inject a hole to the layer 172. Reference numeral 173 is a substrate (not clearly shown) having a 2H type silicon carbide layer, which is formed on alumina through aluminum nitride, and which contains nitrogen having $1 \times 10^{18}/cm^3$. The layer 173 serves to inject an electron to the layer 172. In the drawing, reference numerals 191 and 192 are electrodes.

The light emitter of the above embodiment lightens several times as much as the conventional light emitter.

Figure 14:
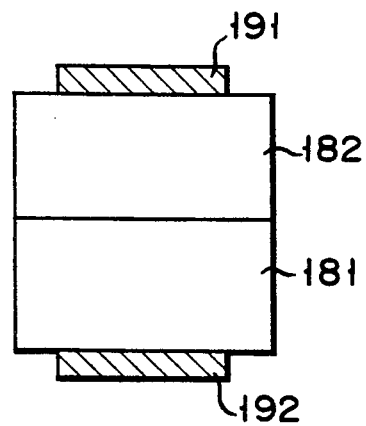

FIG. 14 shows the structure of a light emitter according to an eleventh embodiment of the present invention.

In the drawing, reference numeral 182 is a 4H type silicon carbide in which tellurium of VI group element having $1 \times 10^{17}$ numbers/$cm^3$ and zinc of II group element having $1 \times 10^{16}$ numbers/$cm^3$ are added, and this is used as a light emitting layer in the structure of FIG. 14. Reference numeral 181 is a 4H type silicon carbide containing gallium having $1 \times 10^{17}/cm^3$. The layer 181 serves to inject a hole to the layer 182.

The third embodiment to the eleventh embodiment show the examples of the structure of the light emitter, and the present invention is not limited to the geometrical positions of them. The main aim of the present invention lies in using 4H type silicon carbide containing one or more kinds of II and VI group atoms in the light emitting layer. The present invention is not limited to a geometrical arrangement of a light emitter structure, a method for adding impurity atoms of II or VI groups, or a method for manufacturing 4H type silicon carbide. For example, selenium atoms of II group in solid phase may be mixed with silicon by the LPE method, or these atoms may be added rom the vapor phase with a gas such as dimethyl zind or hydrogen selenide used as ambient atompshere.

Further embodiments of the present invention will be explained.

In an optical semiconductor device having p and n type SiC layers, in a case where dislocation exists in the distance where a minority carrier is diffused from the position of the pn junction, recombination energy of a pair of electron and hole in a conducting state is transmitted through a non-radiation process, and the dislocation is transmitted. In contrast, Ti, Zr, Hf work to control the transmission of the dislocation in a SiC crystal. Therefore, if the impurity is added in the distance where the minority carrier is diffused from the position of the pn junction, the transmission of the dislocation can be effectively controlled.

FIG. 15 shows the structure of the cross section of the light emitter of a twelfth embodiment of the present invention.

In the drawing, reference numeral 211 is an n type 6H-SiC substrate. On the n type 6H-SiC, there is formed an n type SiC layer 212 containing N of concentration of $2 \times 10^{18}$ cm$^{-3}$ and Al of concentration of $1 \times 10^{18}$ cm$^{-3}$ and having a thickness of 5 μm. A p type SiC layer 213 containing Al of concentration of $3 \times 10^{18}$ cm$^{-3}$ and having a thickness of 5 μm is formed thereon. A p side electrode layer 214 comprising two layers of Al and Ti, is formed thereon. An n side electrode layer 215 comprising Ni, is formed on the rear surface of the n type 6H-SiC substrate 211.

The manufacturing method of the above-structure element is a liquid phase epitaxial method using Si as solvent. The temperature of the bottom of a carbon crucible containing Si melt is maintained to 1700° C. Then, the n type 6H-SiC substrate 211 is inserted in the crucible at a portion whose temperature is lower than 1700° C., thereby a crystal growth is performed. C is automatically supplied from the carbon crucible. In a case where the n type SiC 212 is grown on the n type 6H-SiC substrate 211, silicon nitride and Al serving as impurity material are used and Ti is further added. Also, in a case where the p type SiC 213 is grown on the n type SiC 212, Al is sued as an acceptor impurity material, and Ti is further added. After the crystal growth, the impurity concentration of Ti is measured by a secondarily mass separator. The p type layer of Ti has concentration of $2 \times 10^{18}$ cm$^{-3}$, and the n type layer of Ti has concentration of $2 \times 10^{18}$ cm$^{-3}$.

After finishing the crystal growth, Ti and Ai are sequentially vacuum-deposited on eh front surface of the epitaxial layer. Moreover, Ni is deposited on the rear surface of the n type 6H-SiC substrate. Thereafter, a heat treatment is performed at temperature of 1000° C. for 5 min and a wafer is cut to 0.3 mm angle, there can be obtained the element having the structure which is schematically shown in FIG. 15.

FIG. 16 is a view showing a distribution of a minority carrier in the vicinity of the pn junction boundary surface of the twelfth embodiment of FIG. 15, and a distribution of concentration of Ti obtained by a secondary ion mass spectrometry. In this case, a region where the minority carrier is diffused includes a depletion layer in a conducting state and indicates a p or n type region, which is defined by a length $$\sqrt{\tau D}$$

from the end of the depletion layer. Here, r is a life time of the minority carrier, D is a diffusion constant of the minority carrier. Due to the convenience of the explanation, the region can be set where a signal, which can be obtained when an electron beam exciting current is measured, has a peak intensity of 1/e (e=the number of Napier). The region where the minority carrier is diffused changes depending on a carrier concentration in the p or n type layer, and a bias voltage. The value of the length of this embodiment is about 2 μm.

The above embodiment shows the case in which impurity is added beyond the region where the minority carrier is diffused. However, the present invention is not limited to this embodiment. Ti may be added to only a region, which is shown by slanting lines, from the pn junction boundary surface to a position where the concentration of the minority carrier reaches to 1/e of the concentration of the minority carrier in the depletion layer. Moreover, even if Ti is added to one of any portions wherein the minority carrier is diffused, such as only the p type layer, or only the n type layer, or only the depletion layer of the pn junction, effect of the present invention can be expected.

Figure 17:
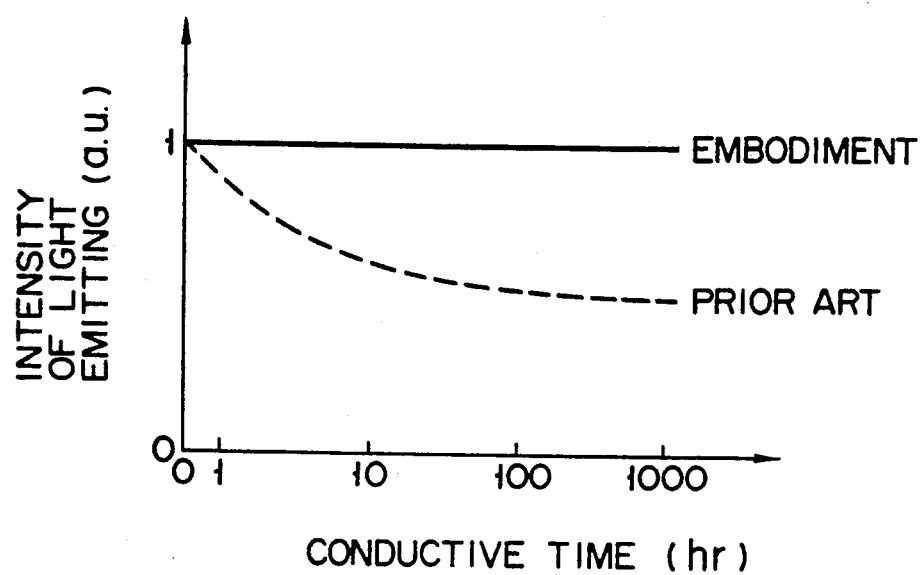
FIG. 17 is a view showing an intensity change of light emitting of the twelfth embodiment with the passage of time.

Rereading the above-formed diode, in order to show effectiveness of the present invention, FIG. 17 shows the change of intensity of light emitting of the light emitter with the passage of time when a voltage is applied to the above-mentioned structure with the Al electrode 214 used as the plus side. FIG. 17 also shows the change of intensity of light emitting of the prior art which does not include Ti with the passage of time. Since the conventional light emitter does not include Ti, intensity of light emitting is reduced right after the electric current supply is started. In contrast, according to the embodiment of the present invention, there is no reduction of intensity of light emitting.

Moreover, in the conventional case, there is a phenomenon in which color of light emitting is changed from blue to green white together with the reduction of intensity of light emitting. In the present invention, such a change is not generated.

According to the experiment made by the inventors, concentration of Ti, which is necessary to control the transmission of dislocation is at least $1 \times 10^{16}$ cm$^{-3}$, and $5 \times 10^{17}$ cm$^{-3}$ is preferable. In this case, concentration means an average value of the impurity doped region.

A thirteenth embodiment of the present invention will be explained with reference to FIG. 18.

FIG. 18 is a view showing an environment resistant transistor using SiC. This transistor is a PNP bipolar transistor in which pn junctions are formed between a collector 252 and a base 253, and between the base 253 and an emitter 254. In this transistor, minority carriers injected from the emitter are little recombined, and the minority carriers flow into the collector and become majority carriers. Due to this, even if the transistor is formed of SiC, defect due to recombination is not often generated. However, since the minority carriers, which are injected from the base to the emitter, are all recombined in the emitter, the defect due to recombination is gradually generated; which reduces a current amplification rate.

According to this embodiment, Ti is added when the p type collector 252 is epitaxially grown. Therefore, substantially the same amount of Ti as p type collector is also contained in the n type base 253, which is formed by diffusing n type dopant to the epitaxial growth layer, and the p type emitter 254 formed by further diffusing Al to the epitaxial growth layer. As a result according to this transistor, generation of defect due to the recombination is not caused in the emitter, and the current amplification rate is not reduced. FIG. 19 shows the Ti concentration of the collector 252, the base 253, and the emitter 254, and the a distribution of the minority carrier of the base 253, and emitter 254. In FIG. 18, reference numerals 255, 256, 257 are electrodes.

Further, a fourteenth embodiment of the present invention will be explained. In this embodiment, the structure of the semiconductor light emitter and its manufacturing method are the same as those of the twelfth embodiment. The different point is that Zr or Hf is used as impurity in place of Ti. Table 1 shows these materials and concentration, which is suitable for controlling the generation of the crystal defect.

TABLE 1

| Material | Concentration | Preferable Concentration |
|---|---|---|
| Zr | $2 \times 10^{16}$ cm$^{-3}$ | $1 \times 10^{18}$ cm$^{-3}$ |
| Hf | $4 \times 10^{16}$ cm$^{-3}$ | $2 \times 10^{18}$ cm$^{-3}$ |

There can be obtained a good effect even if two or three types of Ti, Zr, Hf are combined and used as additive material. Also, if this material is combined with the association of Ge, a large effect can be obtained. Moreover, it is needless to say that there can be obtained the same effect even if these materials are used in the other devices using SiC shown in the thirteenth embodiment.

Regarding the twelfth embodiment to the fourteenth embodiment, the distribution of the concentration of impurity of be added is not uniform. For example, the distribution thereof, which is added by the ion implantation, may be used. Moreover, the structure of the the light emitter may be a multilayer structure such as a double hetero structure. The semiconductor material is not limited to the 6H type SiC. 2H, 4H or 3S type can be used. Furthermore, the growing method of SiC is not limited to the liquid phase epitaxial method. The vapor phase growing method such as CVD may be used, and the adding method of impurity is not particularly limited.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An optical semiconductor device wherein dopant molecules comprising a group II atoms and a group VI atom are added to a semiconductor light emitting layer so as to form associations, each of which associations correspond to each of the dopant molecules added and consists of the group II atoms and the group VI atom located on crystal lattice points in close proximity to each other in the light emitting layer, wherein the electron negativity of said associations is different from that of semiconductor forming the light emitting layer such that each association constitutes an isoelectronic trap and forms an exciton in the light emitting layer, and wherein said group II atoms and said group VI atom in said dopant molecules are chemically bonded to each other, and further wherein the number of the II and VI group atoms of said dopant molecules in said semiconductor light emitting layer is $1 \times 10^{16}$/cm$^3$ to $1 \times 10^{20}$/cm$^3$.

2. The device according to claim 1, wherein said semiconductor light emitting layer is a compound semiconductor.

3. The device according of claim 2, wherein said semiconductor light emitting layer is formed from two kinds of group IV atoms.

4. The device according to claim 3, wherein said semiconductor light emitting layer is formed of SiC.

5. The device according to claim 4, wherein said associations are selected from the group of II-VI atom pairs consisting of BeO, MgO, MgS, ZnO, ZnS, ZnSe, ZnTe, CdO, CdS, CdSe, and CdTe.

6. The device according to claim 1, wherein said semiconductor light emitting layer is formed of a single kind of group IV atom.

7. The device according to claim 6, wherein said semiconductor light emitting layer is formed of diamond.

8. The device according to claim 7, wherein said associations are selected from the group of II-VI atom pairs consisting of BeO, MgO, MgS, ZnO, ZnS, ZnSe, ZnTe, CdO, CdS, CdSe, and CdTe.

9. The device according to claim 2, wherein said semiconductor light emitting layer is formed of BN.

10. The device according to claim 9, wherein said dopant is formed of CdSe.

11. An optical semiconductor device wherein dopant molecules comprising a group III atoms and a group V atom are added to a semiconductor light emitting layer so as to form associations, each of which associations correspond to each of the dopant molecules added and consists of the group III atom and the group V atom located on crystal lattice points in close proximity to each other in the light emitting layer, wherein the electron engativity of said associations is different from that of semiconductor forming the light emitting layer such that each association constitutes an isoelectronic trap and forms an exciton in the light emitting layer, and wherein said group III atom and said group V atom in said dopant molecules are chemically bonded to each other, and further wherein the number of the III and V group atoms of said dopant molecules in said semiconductor light emitting layer is $1 \times 10^{16}$/cm$^3$ to $1 \times 10^{20}$/cm$^3$.

12. The device according to claim 1, wherein said semiconductor light emitting layer is a compound semiconductor.

13. The device according to claim 12, wherein said semiconductor light emitting layer is formed of two kinds of group IV atoms.

14. The device according to claim 13, wherein said semiconductor light emitting layer is formed of SiC.

15. The device according to claim 13, wherein said associations are selected from the group of III-V atom pairs consisting of BN, AlN, AlP, AlAs, AlSb, GaN, GaP, GaAs, and GaSb.

16. The device according to claim 11, wherein said semiconductor light emitting layer is formed of a single kind of group IV atom.

17. The device according to claim 16, wherein said semiconductor light emitting layer is formed of diamond.

18. The device according to claim 17, wherein said associations are selected from the group of III-V atom pairs consisting of BN, AlN, AlP, AlAs, AlSb, GaN, GaP, GaAs, and GaSb.

19. The device according to claim 1, wherein said group II atom and said group VI atom of said associations are located on crystal lattice points which are adjacent to one another in the light emitting layer.

20. The device according to claim 11, wherein said group III atom and said group V atom of said associations are located on crystal lattice points which are adjacent to one another in the light emitting layer.

* * * * *